United States Patent [19]

Policand et al.

[11] 4,213,101

[45] Jul. 15, 1980

[54] PSEUDO-RANDOM BINARY SEQUENCE GENERATOR

[76] Inventors: Gerard Policand, La Marche EA, 1 rue de Nozay, 91310 Montlhery; Jacques Trompette, Residence du Parc, Bat. Les Thuyas, 91700 Villiers sur Orge; Francis Bourrinet, 13 rue Fleming, Le Village A, 91400 Orsay, all of France

[21] Appl. No.: 806,838

[22] Filed: Jun. 15, 1977

Related U.S. Application Data

[63] Continuation of Ser. No. 663,692, Mar. 4, 1976, abandoned.

[30] Foreign Application Priority Data

Mar. 12, 1975 [FR] France ............................... 75 07647

[51] Int. Cl.$^2$ .......................... H03K 3/84; G06F 7/38; H03B 29/00
[52] U.S. Cl. ....................................... 331/78; 328/59; 364/717
[58] Field of Search ............................ 328/59; 331/78; 364/717

[56] References Cited

U.S. PATENT DOCUMENTS

| | | | |
|---|---|---|---|
| 3,521,185 | 7/1970 | Ley | 328/59 X |
| 3,691,472 | 9/1972 | Bohman | 331/78 X |
| 3,742,381 | 6/1973 | Hurd | 331/78 |
| 3,746,847 | 7/1973 | Maritsas | 364/717 |
| 3,811,038 | 5/1974 | Reddaway | 364/717 |
| 3,875,528 | 4/1975 | Hirsch | 331/78 |
| 3,885,139 | 5/1975 | Hurd | 364/717 |
| 3,946,215 | 3/1976 | May | 364/717 |
| 3,963,905 | 6/1976 | Gopinath et al. | 364/717 |
| 4,058,673 | 11/1977 | Johansson | 364/717 X |

Primary Examiner—Larry N. Anagnos
Attorney, Agent, or Firm—Haseltine, Lake & Waters

[57] ABSTRACT

Pseudo-random binary sequence generator using a closed loop shift register. According to the invention, the output of the register feeds a switchable inverter which sends out the pseudo-random sequence of the register, alternately inverted and non-inverted, the inverter being switched once per cycle of the register.

3 Claims, 1 Drawing Figure

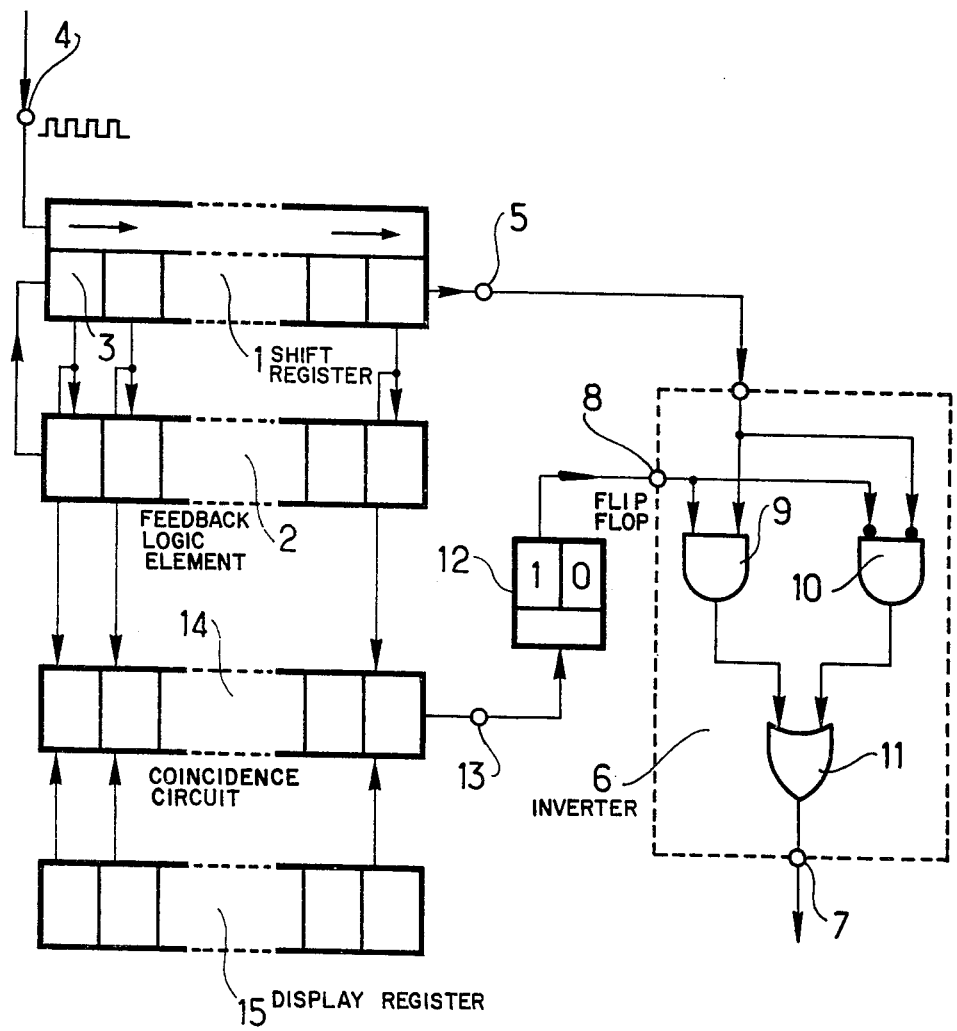

PSEUDO-RANDOM BINARY SEQUENCE GENERATOR

This is a continuation of application Ser. No. 663,692 filed Mar. 4, 1976, now abandoned.

The invention relates to the generation of pseudo-random binary sequences by means of a periodically operated shift register whose input receives a binary value derived from a logic combination of at least two stages of the register.

To verify the proper operation of digital devices, it is often necessary to test them with a random binary sequence. As the production of such a truly random sequence sets problems, it if often found sufficient to have available a pseudo-random sequence whose periodicity is long in relation to the phenomenon to be tested.

It is also known that it is possible to obtain a signal in which the statistical distribution of the amplitudes comes close to that of a Gaussian signal when filtering the binary sequence that leaves such a register through a suitable filter.

With a view to a long periodicity of the sequence, counting codes are applied for the shift register, these codes being called maximum length codes. For a shift register comprising N bistable elements, the maximum length of the sequence is then equal to $2^N-1$ binary elements. By way of an example, it is stated for reference that where $N=3$, a maximum sequence is 1110100. In reality, N is chosen considerably greater than 3, for example 20.

It is observed that, in the above-mentioned sequence, as in all maximum-length sequences, the number of binary elements "1" in the sequence is never identical to that of the binary elements "0". Consequently, the analog signal obtained by the filtering of such a sequence comprises positive peaks the amplitude of which is different from the amplitude of the negative peaks. The distribution of the amplitudes thus shows a dissymmetry between the polarities and the positive peak factors, and the negative peak factors have unequal values.

It is known that this disadvantage may be overcome by inserting in the sequence a binary element "0"(or "1") at each period of the digital sequence. In the example chosen above, that element is added at the end of the sequence. The new sequence thus constituted then contains a sequence of N consecutive binary elements "1" and a sequence of N consecutive binary elements "0". On the other hand, it no longer contains any sequence of N-1 consecutive binary elements of the same kind.

Technically, the insertion of a binary element is effected by interrupting, the shifting of the register at a precise instant, for one clock period. After the insertion of the binary element, the period of the pseudo-random sequence then becomes equal to $2^N$ binary elements.

This method, if it guarantees the equality of the number of binary elements 0 and 1, has the disadvantage of modifying considerably the distribution of the sequences of binary elements of the same kind. The distribution of the amplitudes of the signal obtained after filtering of such a sequence shows a great distortion and falls further away from the Gaussian distribution.

The aim of the invention to to obviate the disadvantage, and it has as its object the generation of a pseudo-random sequence which comprises a strictly equal number of any sequences of binary elements 1 or 0 and which, at the level of the generating of a pseudo-Gaussian noise, shows a perfect symmetry of the analog signal, that is, a positive peak factor equal to the negative peak factor.

A pseudo-random binary sequence generator according to the invention, comprising a periodically operated shift register, whose input receives a binary value which is derived from a logic combination of the states of at least two stages of the register is characterized, by the provision of a switchable inverter which receives the sequence that leaves the register, and which delivers that sequence alternately inverted and non-inverted to an output of the generator, the inverter being switched once per counting cycle of the register.

The principle on which this invention is based consists in periodically complementing the digital sequence. A sequence is thus obtained that has a double-length period and has different characteristics according to the instant at which inverting is effected.

In a preferred exemplary embodiment of the invention, the generator is characterized in that the switch control input of the inverter is connected to the output of a bistable element, a "change" input of which is connected to the output of a decoding network in such a way that the bistable element receives a change pulse when the register is in a definite state. This inversion synchronization method is preferable to a clock-controlled inversion, for it establishes a precise relation between the instant of inversion and the state of the register.

If, on the other hand, it is required, for certain applications, to modify the characteristics of the sequence by modifying that connection, it is possible to provide, as a decoding network, a display register and a coincidence circuit, the latter sending out a change pulse to the bistable element when the state of the shift register coincides with the displayed state. It is therefore only necessary to modify the display if one wishes to modify the characteristics of the sequence.

The invention will be described hereinbelow with reference to an exemplary preferred embodiment, which is illustrated diagrammatically in the single FIGURE of the accompanying drawing.

A periodically operated shift register 1 and a closed-loop logic element or feedback logic 2 constitutes a digital pseudo-random binary sequence generator according to conventional techniques. The logic element feeds a first stage 3 of the register. At each clock pulse, which is applied to a input 4, the contents of the register is shifted, from left to right in the figure, by one stage, and the first stage 3 receives a new binary value of the closed-loop logic element 2.

If the feedback logic 2 element is suitably formed, an output 5 of the last stage of the register 1 sends out a maximum length binary sequence, comprising $2^N-1$ binary elements unequally distributed between the "1"s and the "0"s.

According to the invention, that sequence is supplied to an inverter 6, which sends, to an output 7 of the generator, a pseudo-random sequence whose length is $2^{N+1}-2$ binary elements. That sequence is composed of a first half which is identical to the sequence which is supplied by the register 1 to the output 5, and of a second half which is obtained by a logic inversion of the first half.

For those purposes, the inverter comprises a control input 8 and two branch circuits in parallel, which are energized alternately by the potential applied to the input 8. Each branch circuit contains an AND gate 9 and 10, one of which, 10, is provided with complemented or negative inputs. The two branch circuits feed, alternately, an OR gate 11 which feeds the output 7.

A potential "1" applied to the input 8 of the inverter 6 opens the gate 9 and blocks the gate 10, whereas a potential "0" on the input blocks the gate 9 and opens the gate 10.

The input 8 is connected to the output of a bistable element 12, e.g. a flip-flop, which receives, at an input 13 change pulses coming from a coincidence circuit 14. In the latter the state of the register 1 is compared with the contents of a display register 15. Once in each repetition cycle of the register 1, the coincidence circuit 14 therefore sends out a pulse to the input 13 of the bistable flip-flop 12, the change instant depending only on the contents of the display register 15.

The pseudo-random sequence leaving through the terminal 7 shows, independently from the inversion instant chosen, a strict equality in the number of any sequences of binary elements 1 or 0. Due to that fact, a pseudo-Gaussian noise generator using a generator according to the invention shows a perfect symmetry of the analog signal, that is, the positive peak factor is equal to the negative peak factor. Moreover, the repetition period of the generator is doubled in relation to the repetition period of the shift register 1.

On moving the inversion instant inside the period, there is the possibility of modifying the composition of the sequences of binary elements. More particularly, it is possible to increase the length of the blocks of binary elements of the same kind without having to lengthen the basic shift register. If the generation of a pseudo-Gaussian noise is considered this leads to a free choice of the peak factor, within a wide level range. The generator according to the invention therefore brings in an extra parameter, namely, the position of the inversion instant, and makes it also possible to adjust the distribution of the signal after filtering.

The invention is not limited to the embodiment described hereinabove. It is possible, without departing from the scope of the invention, to dispense with the coincidence circuit 14 and the display register 15 and to provide, in compensation, a shunted clock which makes the bistable flip-flop 12 change once per counting cycle of the register. It is also possible to replace the gate 10 having complemented inputs by a normal AND gate which is fed by the complemented outputs of the last element of the register 1, and of the bistable element 12, respectively.

The design and functional operation of the element 2, which is a conventional element, may be obtained from the following considerations: Firstly, a generator of a pseudo-random binary sequence is well known in the art as comprising a shift register and a feed back logic element. Secondly, it is clearly shown in the drawings that the feed back logic block receives particular outputs of the shift register and delivers via its unique output a binary information for the first bistable 3 of the shift register. Thirdly, there is one specific and very simple example disclosed in the specification for N=3. The sequence in this case is 11101001110100 . . . . For this case, three bistables are provided in the shift register and the sequence is obtained by a feed back block constituted by an EXCLUSIVE OR gate receiving the outputs of the first and the third bistable of the shift register. Suppose that the shift register contains 111: in this case the EXCLUSIVE OR gate delivers 0 to the input of the shift register, and the shift register delivers 1 to its output. The new shift register content is 011. During the next shift operation, the EXCLUSIVE OR gate writes 1 into the first bistable and the shift register output is equally 1. The new state is 101. It may be seen that in repeating this operation, that the output of the register delivers exactly the maximum sequence as indicated in the description. It is equally stated in the specification, that in practice, the number of bistables is considerably greater and that the EXCLUSIVE OR gate might be replaced by a more complex feed back logic block.

We claim:

1. A pseudo-random binary sequence generator arrangement with inverter means; comprising a periodically operated shift register (1) having a counting cycle and feedback logic means receiving predetermined outputs of said shift register and feeding back binary information to said shift register, said shift register having an input responsive to the binary information from said feedback logic means, said feedback logic means being responsive to a logic signal combination of the logic states of at least two stages of said shift register, said inverter means being a switchable inverter (6) having a data input connected to the output (5) of said shift register (1), a control input (8) and an output (7), said inverter delivering to said output the output sequence of said shift register alternately inverted and non-inverted, said inverter being switched over via said control input once per cycle of said register.

2. The sequence generator as defined in claim 1, wherein said control input (8) of the inverter (6) is connected to the output of a bistable element (12), the latter having a "change" input (13) connected to the output of a decoding network (14, 15), said decoding network receiving parallelly the outputs of said register (1) and delivering a change pulse every time said register (1) is in a definite state.

3. The sequence generator as defined in claim 2, wherein said decoding network (14, 15) includes a display register (15) and a coincidence circuit (14), comparing the state of the shift register (1) and of the display register (15) and sending out to said bistable element (12) the change pulse when the state of said shift register (1) coincides with a state as displayed by said display register.

* * * * *